United States Patent
Guo et al.

(10) Patent No.: US 11,367,614 B2
(45) Date of Patent: Jun. 21, 2022

(54) SURFACE ROUGHNESS FOR FLOWABLE CVD FILM

(71) Applicant: Applied Materials, Inc., Santa Clara, CA (US)

(72) Inventors: Jinrui Guo, Santa Clara, CA (US); Jingmei Liang, San Jose, CA (US); Praket P. Jha, San Jose, CA (US); Li Zhang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/929,357

(22) Filed: Jul. 15, 2020

(65) Prior Publication Data

US 2021/0028013 A1 Jan. 28, 2021

Related U.S. Application Data

(60) Provisional application No. 62/877,431, filed on Jul. 23, 2019.

(51) Int. Cl.
| | |
|---|---|
| *H01L 21/02* | (2006.01) |
| *C23C 16/40* | (2006.01) |
| *C23C 16/02* | (2006.01) |
| *C23C 16/34* | (2006.01) |

(52) U.S. Cl.
CPC .... *H01L 21/02315* (2013.01); *C23C 16/0245* (2013.01); *C23C 16/345* (2013.01); *C23C 16/401* (2013.01); *H01L 21/0217* (2013.01); *H01L 21/02164* (2013.01); *H01L 21/02271* (2013.01)

(58) Field of Classification Search
CPC ......... H01L 21/02315; H01L 21/02164; H01L 21/0217; C23C 16/401; C23C 16/345
See application file for complete search history.

(56) References Cited

U.S. PATENT DOCUMENTS

| | | | |
|---|---|---|---|
| 2005/0100670 A1* | 5/2005 | Dussarrat | H01L 21/0214 427/255.393 |
| 2014/0073144 A1* | 3/2014 | Chatterjee | H01L 21/02219 438/793 |
| 2014/0302689 A1 | 10/2014 | Ashtiani et al. | |
| 2015/0004806 A1 | 1/2015 | Ndiege et al. | |
| 2015/0118862 A1* | 4/2015 | Reilly | C23C 16/401 438/778 |
| 2018/0330980 A1 | 11/2018 | Liang et al. | |

FOREIGN PATENT DOCUMENTS

WO 2016137606 A1 9/2016

OTHER PUBLICATIONS

PCT International Search Report and Written Opinion in PCT/US2020/042473 dated Oct. 30, 2020, 12 pages.

* cited by examiner

*Primary Examiner* — Selim U Ahmed
*Assistant Examiner* — Evan G Clinton
(74) *Attorney, Agent, or Firm* — Servilla Whitney LLC

(57) ABSTRACT

Methods for forming a smooth ultra-thin flowable CVD film by using a surface treatment on a substrate surface before flowable CVD film deposition improves the uniformity and overall film smoothness. The flowable CVD film can be cured by any suitable curing process to form a smooth flowable CVD film.

15 Claims, 1 Drawing Sheet

SURFACE ROUGHNESS FOR FLOWABLE CVD FILM

CROSS-REFERENCE TO RELATED APPLICATIONS

This application claims priority to U.S. Provisional Application No. 62/877,431, filed Jul. 23, 2019, the entire disclosure of which is hereby incorporated by reference herein.

TECHNICAL FIELD

The present disclosure relates generally to methods of depositing thin films. In particular, the disclosure relates to processes for improving surface roughness for flowable chemical vapor deposition (CVD) thin films.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. As the dimensions of the structures decrease and the aspect ratios increase post curing methods of the as deposited flowable CVD films become difficult. Resulting in films with varying composition throughout the filled trench.

Conventional plasma-enhanced chemical vapor deposition (PECVD) of dielectric films form a "mushroom shape" film on top of the narrow trenches. This is due to the inability of the plasma to penetrate into the deep trenches. The results in pinching-off the narrow trench from the top; forming a void at the bottom of the trench.

Flowable chemical vapor deposition (FCVD) has been widely used in advanced generations of semiconductor devices. As feature sizes decrease, the required gap fill volume of FCVD films can be reduced greatly compared to previous nodes (e.g. <500 Å or <300 Å). It is critical, but challenging, to deposit thin FCVD films having a smooth and uniform surface as well as high gap fill performance. Accordingly, there is a need for method of improving surface roughness for flowable CVD films.

SUMMARY

One or more embodiments of the disclosure are directed to processing methods. In one embodiment, a process method comprises pre-treating a substrate surface with a plasma to form a smooth pre-treated substrate surface; forming a flowable CVD film on the pre-treated substrate surface by exposing the pre-treated substrate surface to a precursor and a reactant; and curing the flowable CVD film.

Additional embodiments of the disclosure are directed to processing methods comprising pre-treating a substrate surface with a plasma to form a smooth pre-treated substrate surface; flowing trisilylamine (TSA) over the pre-treated substrate, followed by flowing ammonia ($NH_3$) to form a treated substrate; forming a flowable CVD film on the treated substrate by exposing the treated substrate to a precursor and a reactant, the flowable CVD film having a thickness in a range of about 5 nm to about 50 nm; and curing the flowable CVD film.

Further embodiments of the disclosure are directed to processing methods comprising pre-treating a substrate surface with a plasma to form a smooth pre-treated substrate surface; flowing trisilylamine (TSA) over the pre-treated substrate, followed by flowing ammonia ($NH_3$) and oxygen ($O_2$) to form a flowable CVD film having a thickness in a range of about 5 nm to about 50 nm; eliminating oxygen ($O_2$); turning off the flow of ammonia ($NH_3$), while continuing to flow TSA over the treated substrate; and curing the flowable CVD film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
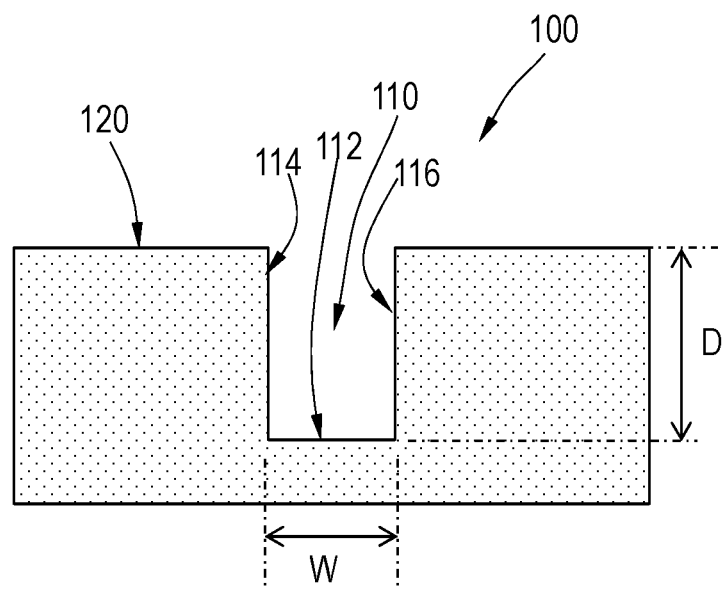
FIG. 1 shows a cross-sectional view of a substrate in accordance with one or more embodiments of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure provide methods of improving surface roughness of a flowable CVD film. Some embodiments advantageously provide methods involving cyclic deposition-treatment processes that can be performed in a cluster tool environment. Some embodiments advantageously provide seam-free high quality, low roughness films that can be used to fill up high aspect ratio (AR) trenches/features with small dimensions.

In one or more embodiments, surface treatment on a substrate surface before flowable chemical vapor deposition (FCVD) advantageously improves the uniformity of the initial nucleation and improves overall smoothness of the flowable CVD film. In one or more embodiments, plasma treatment with inert or reactive gases is found to be effective. In one or more embodiments, the plasma pre-treatment is generated by a remote plasma source (RPS) or a capacitively coupled plasma (CCP) or an inductively coupled plasma (ICP) with ambient like argon (Ar), helium (He), ammonia ($NH_3$), nitrogen ($N_2$), hydrogen ($H_2$), or their mixtures. In one or more embodiments, initial nucleation smoothness can be further improved by changing the order in which the reactants are introduced, changing the flow ratio of the reactants, and by changing the reactants retention time in the chamber during deposition.

In one or more embodiments, ending deposition of the flowable CVD film is critical important for smooth deposition. In one or more embodiments, fast elimination of radical residues and avoiding reaction in unpreferred process regimes at the end of deposition reduces surface roughness significantly.

One or more embodiments of the disclosure are directed to processes where flowable CVD films are deposited which are able to fill high aspect ratio structures (e.g., AR>8:1). Embodiments of the disclosure provide method of pre-treating a substrate surface prior to formation of a flowable CVD film in order to form a smooth surface.

For descriptive purposes, the deposition of flowable CVD films for gapfill applications is described. However, those skilled in the art will understand that the precursors and methods described are not limited to gapfill applications and can be used for any flowable CVD film formation. FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

In one or more embodiments, the substrate 100 has a substrate surface 120. The at least one feature 110 forms an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap.

One or more embodiments of the disclosure are directed to processing methods in which a substrate surface with at least one feature thereon is provided. As used in this regard, the term "provided" means that the substrate is placed into a position or environment for further processing.

Figure 2:
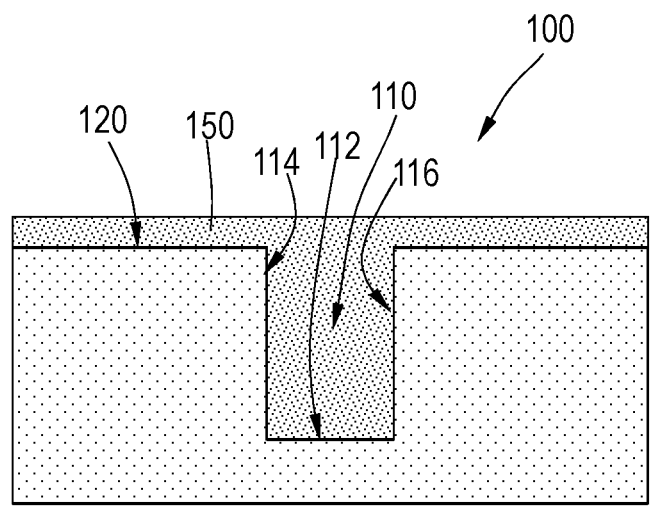
FIG. 2 shows a cross-sectional view of a substrate in accordance with one or more embodiments of the disclosure.

As shown in FIG. 2, a flowable CVD film 150 is formed on the substrate surface 120 and the first sidewall 114, second sidewall 116 and bottom surface 112 of the at least one feature 110. The flowable CVD film 150 fills the at least one feature 110 so that substantially no seam is formed. A seam is a gap that forms in the feature between, but not necessarily in the middle of, the sidewalls of the feature 110. As used in this regard, the term "substantially no seam" means that any gap formed in the film between the sidewalls is less than about 1% of the cross-sectional area of the sidewall.

The flowable CVD film 150 can be formed by any suitable process. In some embodiments, the forming the flowable CVD film is done by plasma-enhanced chemical vapor deposition (PECVD). Stated differently, the flowable CVD film can be deposited by a plasma-enhanced chemical vapor deposition process.

Embodiments of the disclosure advantageously provide methods of pre-treating a substrate surface to form a smooth pre-treat substrate surface that can be use in deposition of flowable CVD films. In one or more embodiments, a substrate surface is pre-treated with a plasma to form a smooth pre-treated substrate surface having chemical bondings that promote smoothness. A flowable CVD film is then formed on the pre-treated substrate surface by exposing the pre-treated substrate surface to a precursor and a reactant. The flowable CVD film is then cured.

In one or more embodiments, the plasma used to pre-treat the substrate surface comprises one or more of argon (Ar), helium (He), hydrogen ($H_2$), nitrogen ($N_2$), or ammonia ($NH_3$).

In one or more embodiments, pre-treating the substrate surface occurs at a pressure in a range of about 5 mTorr to about 100 mTorr. Pre-treating the substrate surface may occur at a temperature in a range of about 25° C. (or ambient temperature) to about 400° C.

Embodiments of the disclosure are directed to processing methods comprising exposing a pre-treated substrate surface to a precursor and a co-reactant to deposit a flowable CVD film. In one or more embodiments, the precursor comprises trisilyamine (TSA). Thus, in one or more embodiments, a substrate surface is pre-treated with a plasma, e.g. argon (Ar), helium (He), hydrogen ($H_2$), nitrogen ($N_2$), or ammonia ($NH_3$), and trisilyamine (TSA) is flowed over the pre-treated substrate surface. After TSA is flowed over the pre-treated substrate surface, ammonia ($NH_3$) is flowed over the substrate surface to form a flowable CVD film on the substrate surface. In one or more embodiments, the ratio of TSA/$NH_3$ is in a range of about 5:1 to about 30:1.

In one or more embodiments, flowing the TSA and flowing the $NH_3$ is conducted in the presence of oxygen ($O_2$). In one or more embodiments, oxygen ($O_2$) is present for the formation of silicon oxide (SiOx) films. In one or more embodiments, ammonia ($NH_3$) is present for the formation of silicon nitride (SiNx) films.

In other embodiments, the flowing the TSA and $NH_3$ is conducted substantially in the absence of oxygen ($O_2$). Stated differently, in one or more embodiments the substrate surface is substantially free of oxygen ($O_2$) when TSA and $NH_3$ are flowed over the substrate surface. As used herein, the term "substantially in the absence of" or the term "substantially free of" means that there is less than 5%, including less than 4%, less than 3%, less than 2%, less than 1%, and less than 0.5% of oxygen present in the atmosphere surrounding the substrate surface.

In one or more embodiments, flowing the TSA over the substrate surface to form the flowable CVD film on the substrate occurs at a pressure in a range of about 0.3 Torr to about 1 Torr. In one or more embodiments, flowing the TSA over the substrate surface to form the flowable CVD film on the substrate (i.e. forming the treated substrate) occurs at a temperature in a range of about 25° C. (or ambient temperature) to about 100° C.

In one or more embodiments, the flowable CVD film that is formed on the pre-treated substrate surface has at thickness in a range of about 5 nm to about 50 nm, including about 10 nm, about 15 nm, about 20 nm, about 25 nm, about 30 nm, about 35 nm, about 40 nm, or about 45 nm. In one or more embodiments, the flowable CVD film is ultra-thin and has a thickness less than or equal to about 50 nm.

In some embodiments, the processing method further comprises eliminating oxygen ($O_2$) from the substrate environment and turning off the flow of ammonia ($NH_3$), while continuing to flow triysilylamine (TSA) over the treated substrate with flowable CVD deposition. Without intending to be bound by theory, it is thought that surface roughness of the flowable CVD film is improved with this termination process. In one or more embodiments, atomic force microscopy (AFM) images show roughness is improved by at least three to four times.

In one or more embodiments, the trisilyamine (TSA) precursor may be vaporized to a CVD chamber, and a suitable co-reactant (e.g., ammonia ($NH_3$), oxygen ($O_2$), carbon dioxide ($CO_2$), carbon monoxide (CO), argon (Ar), helium (He), hydrogen ($H_2$), or any combination thereof) can be delivered to the chamber through, for example, a remote plasma source (RPS), which will generate plasma active species as the co-reactants. Plasma activated co-reactant molecules (radicals) have high energies and may react with trisilylamine (TSA) precursor molecules in the gas phase to form corresponding flowable polymers. In some embodiments, the plasma is generated with a plasma gas that comprises one or more of $NH_3$, $O_2$, $CO_2$, CO, Ar, He, or $H_2$.

In one or more embodiments, the plasma can be generated or ignited within the processing chamber (e.g., a direct plasma) or can be generated outside of the processing chamber and flowed into the processing chamber (e.g., a remote plasma).

Referring to FIG. 2, the flowable CVD film 150 can be formed at any suitable temperature. In some embodiments, the flowable CVD film 150 is formed at a temperature in the range of about 10° C. to about 100° C. The temperature can be kept low to preserve the thermal budget of the device being formed. In some embodiments, forming the flowable CVD film occurs at a temperature less than about 300° C., 250° C., 200° C., 150° C., 100° C., 75° C., 50° C., 25° C. or 0° C.

The composition of the flowable CVD film can be adjusted by changing the composition of the reactive gas. In some embodiments, the flowable CVD film comprises one or more of silicon carbide (SiC), silicon oxycarbide (SiOC), silicon carbonitride (SiCN), silicon oxycarbonitride (SiOCN), silicon oxide (SiO) and silicon nitride (SiN). To form an oxygen containing film, the co-reactant may comprise, for example, one or more of oxygen, ozone or water. To form a nitrogen containing film, the co-reactant may comprise, for example, one or more of ammonia, hydrazine, $NO_2$ or $N_2$. To form a carbon containing film, the reactive gas may comprise, for example, one or more of propylene and acetylene. Those skilled in the art will understand that combinations of or other species can be included in the reactive gas mixture to change the composition of the flowable CVD film.

The flowable CVD film may deposit on the wafer (temperature of the wafer can be from −10° C. to 200° C.) and due to their flowability, polymers will flow through trenches and make a gap-fill. Then these films are subjected to curing steps such as ozone/UV/steam annealing/$NH_3$ annealing to get stable films. In one or more embodiments, after formation of the flowable CVD film 150, the film may be cured to solidify the flowable CVD film and form a substantially seam-free gapfill. In one or more embodiments, curing the flowable CVD film comprises exposing the flowable CVD film to one or more of ozone, UV light, steam annealing, ammonia annealing and oxygen plasma. In some embodiments, the flowable CVD film is cured by exposing the film to a UV curing process. The UV curing process can occur at a temperature in the range of about 10° C. to about 550° C. The UV curing process can occur for any suitable time frame necessary to sufficiently solidify the flowable CVD film. The UV cure can be performed with different parameters, e.g., power, temperature, environment. In some embodiments, the UV cure occurs in an acetylene/ethylene environment.

In some embodiments, curing the flowable CVD film comprises thermal annealing. Thermal annealing can occur at any suitable temperature and any suitable environment. In some embodiments, the flowable CVD film is cured by thermal annealing in an acetylene/ethylene environment.

In some embodiments, curing the flowable CVD film comprises exposure to a plasma or an electron beam. A plasma exposure to cure the film comprises a plasma separate from the PECVD plasma. The plasma species and processing chamber can be the same and the plasma cure is a different step than the PECVD process.

In some embodiments, curing the flowable CVD film comprises exposing the flowable CVD film to a steam anneal and/or oxygen plasma. The use of a steam anneal and/or oxygen plasma may reduce the carbon content of the flowable CVD film so that the cured film has a lower carbon content than the as-deposited flowable CVD film. The use of steam anneal and/or oxygen plasma may convert the deposited flowable SiC, SiCN, or SiOC film to SiO.

In some embodiments, the trisilyamine (TSA) precursor can be used with another precursor (e.g. co-flow with another Si-containing precursor) in a flowable process to deposit films of various compositions. As an example, precursors containing silicon and hydrocarbon groups can be used with the trisilylamine (TSA)/$NH_3$ process to incorporate carbon into the flowable CVD film. In one or more embodiments, the flowable CVD films obtained from TSA/$NH_3$ process are either SiO or SiN films. By the addition of a precursor containing carbon and silicon, SiOC, SiCON or SiCN films can be deposited.

In some embodiments, the flowable CVD film can be doped with another element. For example, in one or more embodiments, the flowable CVD film may be doped with one or more of boron (B), arsenic (As), or phosphorous (P). The flowable CVD films can be doped with elements such as boron (B) and phosphorous (P) to improve film properties. Precursors containing boron and phosphorous can be either co-flowed with the trisilylamine (TSA) and ammonia ($NH_3$) precursors during the deposition process or can be infiltrated after the deposition is done. Boron containing precursors can be aminoboranes/boranes compounds and phosphorous containing precursors can be phosphate/phosphite compounds. In some embodiments, doping the flowable CVD film comprises co-flowing a dopant precursor with the trisilylamine (TSA) and ammonia ($NH_3$) precursors. In some embodiments, doping the flowable CVD film comprises implantation of the dopant element in a separate process.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition, plasma treatment, UV curing, and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   pre-treating a substrate surface with a plasma to form a smooth pre-treated substrate surface;
   flowing trisilylamine (TSA) over the pre-treated substrate, followed by flowing ammonia ($NH_3$) to form a treated substrate, wherein flowing the TSA and $NH_3$ is conducted in the presence of oxygen ($O_2$);
   eliminating oxygen ($O_2$);
   turning off the flow of ammonia ($NH_3$), while continuing to flow TSA over the treated substrate;
   forming a flowable CVD film on the treated substrate surface by exposing the treated substrate surface to a precursor and a reactant;
   curing the flowable CVD film.

2. The method of claim 1, wherein the plasma comprises one or more of argon (Ar), helium (He), hydrogen ($H_2$), nitrogen ($N_2$), or ammonia ($NH_3$).

3. The method of claim 1, wherein pre-treating the substrate surface occurs at a pressure in a range of about 5 mTorr to about 100 mTorr.

4. The method of claim 3, wherein pre-treating the substrate surface occurs at a temperature in a range of about 25° C. to about 400° C.

5. The method of claim 1, wherein the ratio of TSA/NH$_3$ is in a range of about 5:1 to about 30:1.

6. The method of claim 1, wherein forming the treated substrate occurs at a pressure in a range of about 0.3 Torr to about 1 Torr.

7. The method of claim 6, wherein forming the treated substrate occurs at a temperature in a range of about 25° C. to about 100° C.

8. The method of claim 1, wherein the flowable CVD film has a thickness in a range of about 5 nm to about 50 nm.

9. A processing method comprising:
pre-treating a substrate surface with a plasma to form a smooth pre-treated substrate surface;
flowing trisilylamine (TSA) over the pre-treated substrate, followed by flowing ammonia (NH$_3$) to form a treated substrate;
forming a flowable CVD film on the treated substrate by exposing the treated substrate to a precursor and a reactant, the flowable CVD film having a thickness in a range of about 5 nm to about 50 nm;
curing the flowable CVD film;
eliminating oxygen (O$_2$); and
turning off the flow of ammonia (NH$_3$), while continuing to flow TSA over the treated substrate.

10. The method of claim 9, wherein the ratio of TSA/NH$_3$ is in a range of about 5:1 to about 30:1.

11. The method of claim 9, wherein flowing the TSA and NH$_3$ is conducted in the presence of oxygen (O$_2$).

12. The method of claim 9, wherein flowing the TSA and NH$_3$ is conducted substantially in the absence of oxygen (O$_2$).

13. The method of claim 9, wherein forming the treated substrate occurs at a pressure in a range of about 0.3 to about 1 Torr.

14. The method of claim 13, wherein forming the treated substrate occurs at a temperature in a range of about 10° C. to about 100° C.

15. A processing method comprising:
pre-treating a substrate surface with a plasma to form a smooth pre-treated substrate surface;
flowing trisilylamine (TSA) over the pre-treated substrate, followed by flowing ammonia (NH$_3$) and oxygen (O$_2$) to form a flowable CVD film having a thickness in a range of about 5 nm to about 50 nm;
eliminating oxygen (O$_2$);
turning off the flow of ammonia (NH$_3$), while continuing to flow TSA over the treated substrate; and
curing the flowable CVD film.

* * * * *